United States Patent

Chiu

(10) Patent No.: US 12,412,818 B2
(45) Date of Patent: Sep. 9, 2025

(54) STRUCTURE OF PACKAGE SUBSTRATE

(71) Applicant: PRINCO CORP., Hsinchu (TW)

(72) Inventor: Pei-Liang Chiu, Hsinchu (TW)

(73) Assignee: PRINCO CORP., Hsinchu (TW)

( * ) Notice: Subject to any disclaimer, the term of this patent is extended or adjusted under 35 U.S.C. 154(b) by 398 days.

(21) Appl. No.: 18/115,865

(22) Filed: Mar. 1, 2023

(65) Prior Publication Data

US 2023/0317587 A1  Oct. 5, 2023

(30) Foreign Application Priority Data

Mar. 14, 2022  (TW) .................................. 111109272

(51) Int. Cl.
*H01L 23/49* (2006.01)
*H01L 23/15* (2006.01)
*H01L 23/498* (2006.01)

(52) U.S. Cl.
CPC ........ *H01L 23/49822* (2013.01); *H01L 23/15* (2013.01); *H01L 23/49827* (2013.01)

(58) Field of Classification Search
CPC ............... H01L 23/49822; H01L 23/15; H01L 23/49827; H01L 23/49833; H01L 23/49838; H01L 23/49866
See application file for complete search history.

(56) References Cited

U.S. PATENT DOCUMENTS

| | | | |
|---|---|---|---|
| 827,856 A * | 8/1906 | Fatch | A01B 1/022 294/51 |
| 9,159,648 B2 | 10/2015 | Koizumi et al. | |
| 10,297,521 B2 * | 5/2019 | Abe | H01L 23/15 |
| 10,299,374 B2 * | 5/2019 | Shashkov | H05K 1/028 |
| 11,516,911 B2 | 11/2022 | Kijima | |
| 12,057,410 B2 * | 8/2024 | Wu | H01L 21/4853 |
| 2005/0126818 A1 * | 6/2005 | Kojima | H05K 3/4602 174/262 |
| 2014/0167255 A1 * | 6/2014 | Shaue | H01L 23/4985 257/737 |
| 2015/0334823 A1 | 11/2015 | Hu | |

(Continued)

FOREIGN PATENT DOCUMENTS

| | | |
|---|---|---|
| JP | 2010532924 A | 10/2010 |
| JP | 2014022465 A | 2/2014 |

(Continued)

*Primary Examiner* — S M Sohel Imtiaz
(74) *Attorney, Agent, or Firm* — Rivka Friedman

(57) ABSTRACT

A structure of a package substrate includes: a first multi-layer substrate including a plurality of dielectric layers and a plurality of metal wiring layers and having a first surface and a second surface which are opposite to each other; and a supporting substrate having a first surface and a second surface which are opposite to each other, wherein the first surface of the supporting substrate is disposed on the second surface of the first multi-layer substrate and electrically connected to the first multi-layer substrate, there is no gap between the first surface of the supporting substrate and the second surface of the first multi-layer substrate, the supporting substrate includes a plurality of vertical vias, and the vertical vias are used for electrically connecting the first surface of the supporting substrate to the second surface of the supporting substrate.

9 Claims, 5 Drawing Sheets

(56) References Cited

U.S. PATENT DOCUMENTS

| | | | | |
|---|---|---|---|---|
| 2021/0202332 A1* | 7/2021 | Hu | ..................... | H01L 21/6835 |
| 2021/0391269 A1* | 12/2021 | Park | ................... | H01L 23/5385 |
| 2022/0051957 A1* | 2/2022 | Koh | ..................... | H01L 21/561 |
| 2022/0344250 A1* | 10/2022 | Choi | .................... | H01L 21/486 |
| 2022/0359354 A1* | 11/2022 | Lin | .................. | H01L 23/49816 |
| 2023/0011941 A1* | 1/2023 | Jung | .................. | H01L 21/4853 |
| 2023/0300983 A1* | 9/2023 | Umehara | ............... | H05K 3/426 |
| | | | | 174/261 |

FOREIGN PATENT DOCUMENTS

| | | | |
|---|---|---|---|
| JP | 2019204921 | A | 11/2019 |
| KR | 20160121506 | A | 10/2016 |
| KR | 20210148846 | A | 12/2021 |
| TW | 200901847 | A | 1/2009 |
| TW | 201426924 | A | 7/2014 |
| TW | 202201667 | A | 1/2022 |
| TW | 202209518 | A | 3/2022 |
| WO | 2016175206 | A1 | 11/2016 |
| WO | 2022024907 | A1 | 2/2022 |

* cited by examiner

STRUCTURE OF PACKAGE SUBSTRATE

FIELD OF DISCLOSURE

The present disclosure relates to the technical field of package substrates, and more particularly to a structure of a package substrate.

BACKGROUND

With the continuous development of wafer miniaturization technology, external electrical connection points of a chip in the future will become smaller and thinner, and a distance between two electrical connection points will also become smaller and smaller. Under such a trend, in a circuit board connected to the chip, it is necessary to achieve no height difference between each pad layer and a surface dielectric layer connected to a corresponding connected surface of the chip, so as to eliminate bubbles which are generated due to the height difference between each pad layer and the surface dielectric layer when the chip and the circuit board are completely bonded to each other. Furthermore, the circuit board itself which is connected to the chip must also be very precise. That is, a distance between two adjacent pad layers which are connected to the corresponding connected surface of the chip is very small, and the circuit board itself should be extremely thin to meet the needs of package in the future. Mechanical support of the circuit board must also be made very flat to ensure a high success rate of chip package. There are often more than 20,000 electrical connection points in a 2 cm (centimeter)×2 cm die. These electrical connection points will become thinner and thinner (that is, smaller). When the die is pasted on a surface of an uneven circuit board, it causes poor bonding or even failure.

From the perspective of a traditional printed circuit board (PCB), the above-mentioned two requirements are more and more unsatisfactory. One reason is that a body of the circuit board is constituted by an organic material such as FR4, which cannot be ground or polished to achieve high flatness.

As shown in FIG. 1, an existing better solution is to use a ceramic substrate produced by a co-firing method as the body of the circuit board. FIG. 1 illustrates a manufacturing process and a structure in co-fired ceramic technology in the prior art. However, regardless in a high-temperature co-fired ceramic (HTCC) process or a low-temperature co-fired ceramic (LTCC) process, ceramic powder is mixed with a 4%~8% organic binder during a sintering process, so that the ceramic powder can be combined with each other during the sintering process (30%~50% more low-melting point glass frit is added in the low-temperature co-fired ceramic process than in the high-temperature co-fired ceramic process). During the sintering process (the high-temperature co-fired ceramic process is about 1600° C., and the low-temperature co-fired ceramic process is about 850~900° C.), the organic binder is vaporized to form a relatively pure ceramic material, but it also causes holes and stresses in the sintered ceramic substrate and inevitably leads to coexistence of holes and deformation in the sintered ceramic substrate.

When the ceramic substrate produced by the above-mentioned co-fired ceramic method is applied to the above-mentioned package substrate (the circuit board), only a small-area co-fired ceramic substrate can be selected. This is because its area is small, and a vertical deformation is relatively small. That is, the above-mentioned co-fired ceramic method can only be applied to smaller chips.

Accordingly, traditional PCB circuit boards or co-fired ceramic substrates will have problems when facing high flatness requirements of high-end package circuit boards in the future.

SUMMARY OF DISCLOSURE

The present disclosure provides a structure of a package substrate capable of solving the problems in the prior art.

The structure of the package substrate includes: a first multi-layer substrate including a plurality of dielectric layers and a plurality of metal wiring layers and having a first surface and a second surface which are opposite to each other, wherein the dielectric layers and the metal wiring layers are alternately stacked, the dielectric layers are adhered each other, the metal wiring layers are individually embedded in the corresponding dielectric layers, and a dielectric layer located in the first surface of the multi-layer substrate is used as a solder mask layer which is embedded with at least one pad layer; and a supporting substrate having a first surface and a second surface which are opposite to each other, wherein the first surface of the supporting substrate is disposed on the second surface of the first multi-layer substrate and electrically connected to the first multi-layer substrate, there is no gap between the first surface of the supporting substrate and the second surface of the first multi-layer substrate, the supporting substrate includes a plurality of vertical vias, the vertical vias are used for electrically connecting the first surface of the supporting substrate to the second surface of the supporting substrate, and at least one electrical connection point is disposed on the second surface of the supporting substrate to electrically connect to a circuit board or an electronic component.

In the structure of the package substrate of the present disclosure, the first multi-layer substrate covers the extremely flat supporting substrate, and there is no gap between the supporting substrate and the first multi-layer substrate. As long as a thickness uniformity of the first multi-layer substrate is controlled, the very thin first multi-layer substrate faithfully reflects flatness of the supporting substrate to a surface of the structure of the package substrate, so that the surface of the structure of the package substrate is very flat and beneficial to a bonding state with a chip.

DETAILED DESCRIPTION

To make the objectives, technical schemes, and technical effects of the present disclosure clearer and more definitely, the present disclosure will be described in detail below by using embodiments in conjunction with the appending drawings. It should be understood that the specific embodiments described herein are merely for explaining the present disclosure, and as used herein, the term "embodiment" refers to an instance, an example, or an illustration but is not intended to limit the present disclosure. In addition, the articles "a" and "an" as used in the specification and the appended claims should generally be construed to mean "one or more" unless specified otherwise or clear from the context to be directed to a singular form. Also, in the appending drawings, the components having similar or the same structure or function are indicated by the same reference number.

Structures of package substrates in accordance with various embodiments of the present disclosure will be described below with reference to FIG. 2 to FIG. 6.

Figure 1:
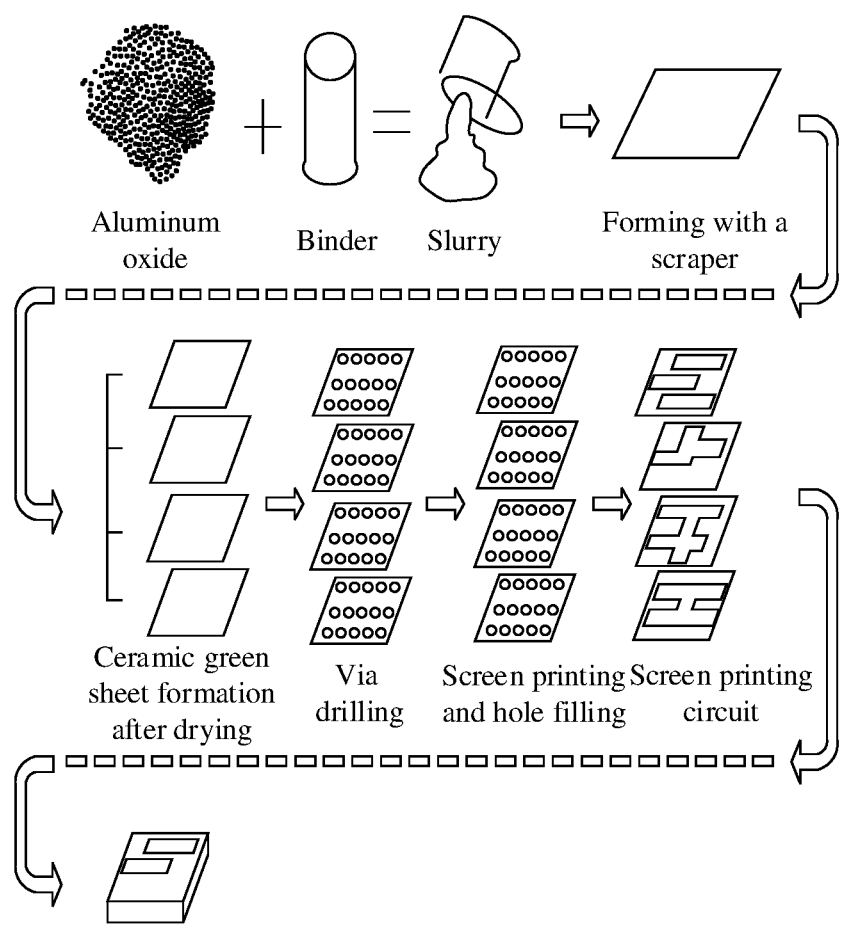
FIG. 1 illustrates a manufacturing process and a structure in co-fired ceramic technology in the prior art.
Figure 2:
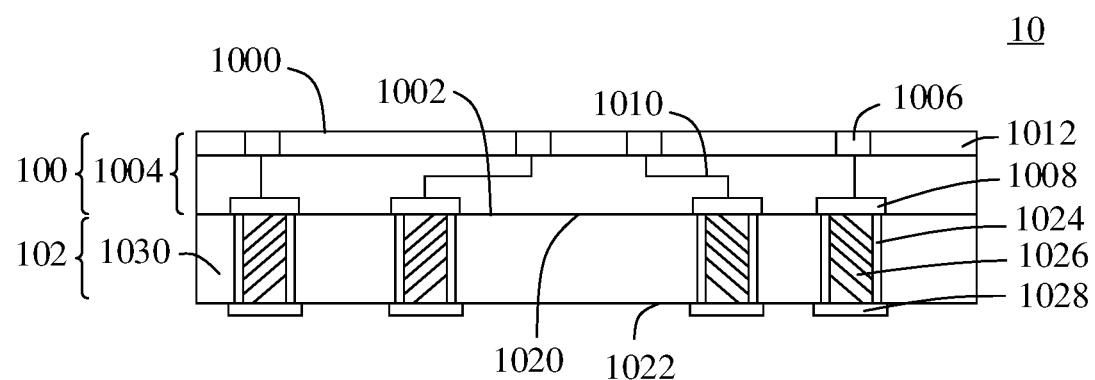
FIG. 2 illustrates a schematic cross-sectional view of a structure of a package substrate in accordance with one embodiment of the present disclosure.

Please refer to FIG. 2. FIG. 2 illustrates a schematic cross-sectional view of a structure 10 of a package substrate in accordance with one embodiment of the present disclosure. The structure 10 of the package substrate includes a first multi-layer substrate 100 and a supporting substrate 102. The first multi-layer substrate 100 is a multi-layer film substrate and has a first surface 1000 and a second surface 1002 opposite to each other. In the present embodiment, the supporting substrate 102 can be a crystal-grown ceramic substrate, a glass substrate, or a rigid substrate which can provide a flat surface. A material of the crystal-grown ceramic substrate includes aluminum oxide ($Al_2O_3$) crystals or aluminum nitride (AlN) crystals. The supporting substrate 102 also has a first surface 1020 and a second surface 1022 opposite to each other. The supporting substrate 102 has a plurality of vertical vias 1024. The supporting substrate 102 has an electrically conductive material 1026 (shown by oblique lines) filled in the vertical vias 1024, so that the first surface 1020 of the supporting substrate 102 is electrically connected to the second surface 1022. The first surface 1020 of the supporting substrate 102 is disposed on the second surface 1002 of the first multi-layer substrate 100 and electrically connected to the first multi-layer substrate 100. There is no gap between the first surface 1020 of the supporting substrate 102 and the second surface 1002 of the first multi-layer substrate 100, so that the supporting substrate 102 can provide a flat surface to control the first multi-layer substrate 100 to have a flat surface. At least one electrical connection point 1028 (plural electrical connection points 1028 are shown in FIG. 2) is disposed on the second surface 1022 of the supporting substrate 102 to electrically connect to another circuit board (not shown) or another electronic component (not shown).

As mentioned above, the supporting substrate 102 can be made of aluminum oxide, aluminum nitride or other ceramic materials formed by a crystal growth method. Since the ceramic substrate is generated by the crystal growth method, there are no holes. Furthermore, an extremely smooth and rigid surface can be formed through grinding and polishing. This can effectively solve disadvantages of co-fired ceramic substrates. Moreover, the supporting substrate 102 can also be a glass substrate, and the glass substrate can also provide an extremely flat and rigid surface.

In the present disclosure, the structure 10 of the package substrate is formed by covering the extremely flat supporting substrate 102 with the first multi-layer substrate 100 of which a body can be made of a flexible dielectric material, such as polyimide. There is no gap between the supporting substrate 102 and the first multi-layer substrate 100. As long as a thickness uniformity of the first multi-layer substrate 100 is controlled, the very thin first multi-layer substrate 100 faithfully reflects flatness of the supporting substrate 102 to a surface of the structure 10 of the package substrate, so that the surface of the structure 10 of the package substrate is very flat and beneficial to a bonding state with a chip.

As shown in FIG. 2, the first multi-layer substrate 100 includes a first body 1004, at least one pad layer 1006 (plural pad layers 1006 are shown in FIG. 2), at least one electrical connection point 1008 (plural electrical connection points 1008 are shown in FIG. 2), and at least one inner metal layer 1010 (plural inner metal layers 1010 are shown in FIG. 2). A material of the first body 1004 is polyimide (PI). The pad layers 1006 are all embedded (i.e., buried) in the first body 1004 and located inside the first surface of the first multi-layer substrate 100. The electrical connection points 1008 are formed inside the second surface 1002 of the first multi-layer substrate 100. The inner metal layers 1010 are disposed inside the first body 1004. At least one of the pad layers 1006 is electrically connected to at least one of the electrical connection points 1008 through the at least one inner metal layer 1010. The first body 1004 includes a dielectric layer 1012. The pad layers 1006 are all embedded (i.e., buried) in the dielectric layer 1012. Surfaces of the pad layers 1006 and a surface of the dielectric layer 1012 together form the first surface 1000 of the first multi-layer substrate 100. It should be noted that in the present embodiment, the pad layers 1006 are completely embedded in the dielectric layer 1012. In another embodiment, the pad layers 1006 are partially embedded in the dielectric layer 1012.

A number of layers of the first multi-layer substrate 100 can be 2 to 20 layers. The dielectric layer 1012 has a thickness of 5 micrometers (μm) to 20 micrometers, and its material can be an organic dielectric material, such as polyimide. A height of each of the pad layers 1006, a thickness of each of the inner metal layers 1010, and a height of each of the electrical connection points 1008 are 1 micron to 10 microns, and a line width of each of the inner metal layers 1010 is 2 microns to 100 microns. It should be noted that at least one of the inner metal layers 1010 can be in a form of an entire metal layer to serve as a power layer or a ground layer. A size of a via of each of the inner metal layers 1010 is 2 microns to 50 microns.

An implementation of connecting electrical connection points of a bare die (not shown) to the pad layers 1006 of the first surface 1000 of the multi-layer substrate 100 in the structure 10 of the package substrate 10 can be achieved by ultrasonic welding through an alignment mechanism. However, the present disclosure is not limited thereto.

The bare die packaged on the package 10 of the substrate structure is easy to discharge the heat because a heating part of the bare die of the heating part is not sealed. When copper wires, metal fins, or heat pipes are connected to a backside of the bare die to enhance the heat dissipation, the best heat conduction function can be achieved. The heat conduction performance is becoming more and more important on a chip with increasingly powerful functions.

Figure 3:
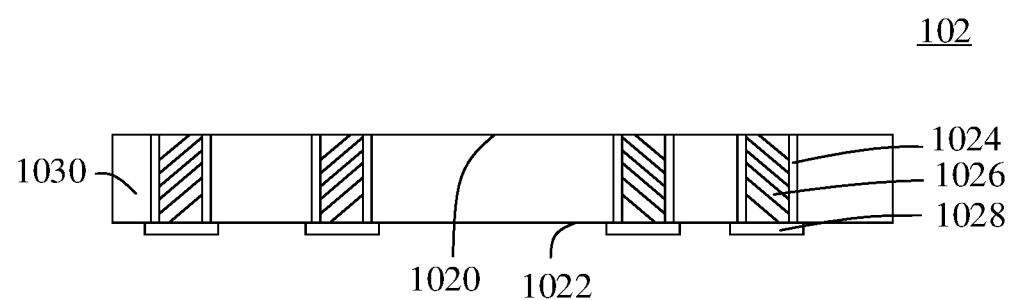
FIG. 3 illustrates a detailed cross-sectional view of a supporting substrate in the structure of the package substrate in FIG. 2.

Please refer to FIG. 3. FIG. 3 illustrates a detailed cross-sectional view of the supporting substrate 102 in the structure 10 of the package substrate in FIG. 2. The supporting substrate 102 includes a second body 1030, the vertical vias 1024, the electrically conductive material 1026, and the electrical connection points 1028. A material of the second body 1030 is aluminum oxide ($Al_2O_3$). The vertical vias 1024 penetrate the second body 1030 to communicate the first surface 1020 of the supporting substrate 102 and the second surface 1022 of the supporting substrate 102. The vertical vias 1024 can be formed by a laser method or an etching method. The electrically conductive material substances 1026 is filled in the vertical vias 1024, and its material is copper. The conductive material 1026 in the vertical vias 1024 contacts the electrical connection points 1008 of the first multi-layer substrate 100 and the electrical connection points 1028 on the second surface 1022. The conductive material 1026 can be formed by placing copper wires into the vertical vias 1024 or injecting liquid copper into the vertical vias 1024.

Figure 4A:
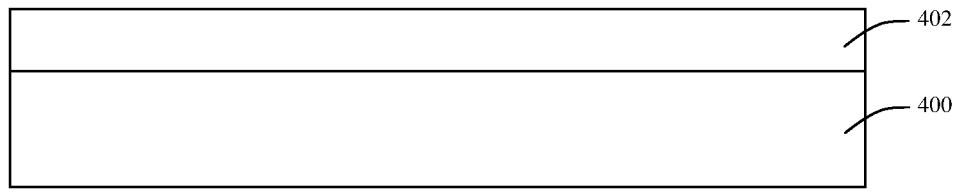
FIG. 4A to FIG. 4C illustrate a flow chart of manufacturing a multi-layer substrate according to one embodiment of the present disclosure.
Figure 4B:
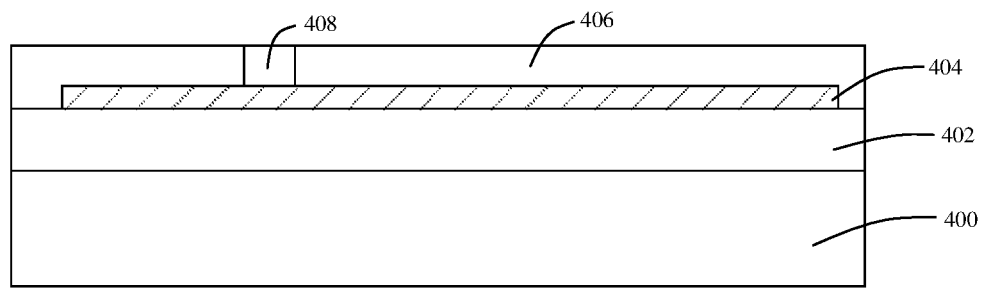
Figure 4C:
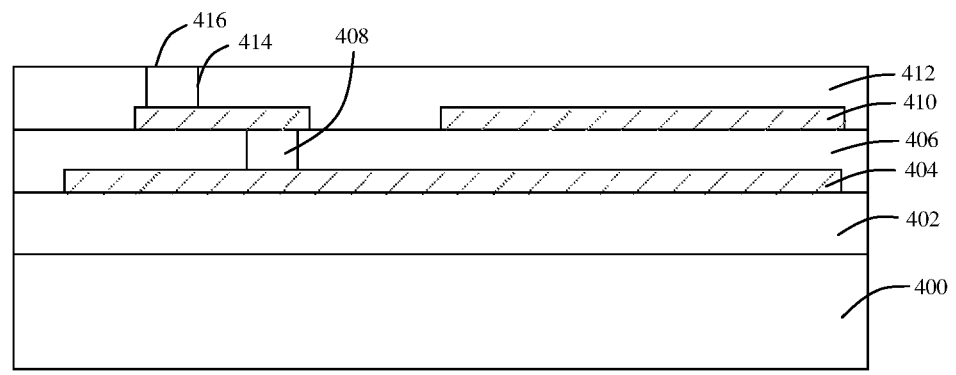

Please refer to FIG. 4A to FIG. 4C. FIG. 4A to FIG. 4C illustrate a flow chart of manufacturing a multi-layer substrate according to one embodiment of the present disclosure.

In FIG. 4A, a carrier 400 is provided. The carrier 400 is the supporting substrate 102 in FIG. 2. A first dielectric layer 402 is formed on the carrier 400. In FIG. 4B, a metal wiring layer 404 is formed on the first dielectric layer 402. After the metal wiring layer 404 is patterned, a second dielectric layer 406 is formed on the metal wiring layers 404. A via 408 is formed in the second dielectric layer 406. In FIG. 4C, another metal wiring layer 410 is formed on the second dielectric layer 406. After the another metal wiring layer 410 is patterned, another second dielectric layer 412 and another via 414 are formed on the another metal wiring layer 410. Metal is filled her metal wiring layer 410. A surface of the another via 414 is filled with metal to form a pad layer 416. The rest can be deduced to form the first multi-layer substrate 100 as shown in FIG. 2.

In the present embodiment, after the first dielectric layer 402, the second dielectric layer 406, and the another second dielectric layer 412 are formed by spin coating, these dielectric layers are dried to be hardened. For the fabrication of the metal wiring layers, the metal wiring layer 404 and the another metal wiring layer 410 can be formed by vacuum sputtering copper (Cu). Then, the fabrication of the wirings is completed by photolithography, development, and etching processes. As for the via 408 and the another via 414 between the metal layers, they can be formed by drilling holes in the second dielectric layer 406 and the another second dielectric layer 412 by laser and then filling copper by electroplating.

As mentioned above, in FIG. 4C, a structure formed by the first dielectric layer 402, the metal wiring layer 404, the second dielectric layer 406, the via 408, the another metal wiring layer 410, the another second dielectric layer 412, the another via 414, and the pad layer 416 is the first multi-layer substrate 100 in FIG. 2. Accordingly, as shown in FIG. 2, the first multi-layer substrate 100 includes at least one dielectric layer 1012 and at least one pad layer 1006 formed in the dielectric layer 1012. There is no height difference between an upper surface of the pad layer 1006 and an upper surface of the dielectric layer 1012. When the pad layer 1006 of the structure 10 of the package substrate is correspondingly connected to electrical connection points of a chip (not shown), there is no gap between the package substrate 10 and the electrical connection points of the chip. Accordingly, bubble are not generated between the chip and the structure 10 of the package substrate.

Since the structure formed in FIG. 4C is the first multi-layer substrate 100 in FIG. 2, it can be seen from FIG. 4C that the first multi-layer substrate 100 in FIG. 2 includes a plurality of dielectric layers and a plurality of metal wiring layers. The dielectric layers and the metal wiring layers are alternately stacked, and the dielectric layers are adhered each other. As such, the metal wiring layers are individually embedded in the corresponding dielectric layers. The dielectric layer 1012 located in the first surface 1000 of the multi-layer substrate 100 is used as a solder mask layer which is embedded with the at least one pad layer 1006.

Figure 5A:
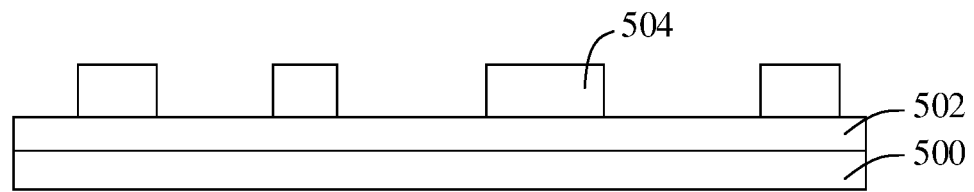
FIG. 5A to FIG. 5C illustrate a flow chart that there is no height difference between a pad layer and a dielectric layer in a first surface of a first multi-layer substrate manufactured in FIG. 2.
Figure 5B:
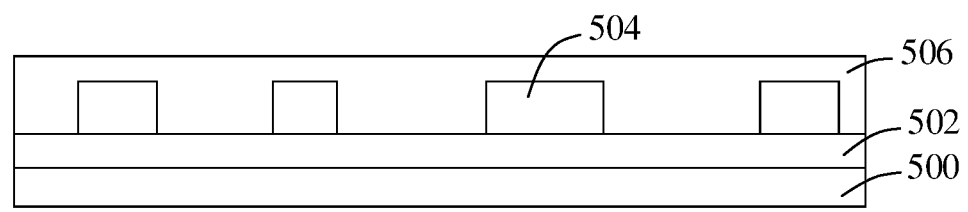
Figure 5C:
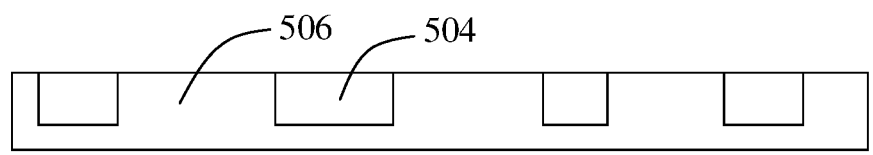

Please refer to FIG. 5A to FIG. C. FIG. 5A to FIG. 5C illustrate a flow chart that there is no height difference between the pad layer 1006 and the dielectric layer 1012 in the first surface 1000 of the first multi-layer substrate 100 manufactured in FIG. 2.

In FIG. 5A, a silicon wafer with good surface flatness is provided as a carrier 500. A solder mask layer 502 is formed on the carrier 500 by a coating method. Then, at least one pad layer 504 is formed on the solder mask layer by an etching method, an electroplating method, or a lithography method.

In FIG. 5B, a dielectric layer 506 is formed on the solder make layer 502 and the at least one pad layer 504. The dielectric layer 506 covers the at least one pad layer 504 and the solder mask layer 502. More specifically, the at least one pad layer 504 is completely embedded in the dielectric layer 506 (as shown in FIG. 5C). After the dielectric layer 506 is formed, subsequent manufacturing processes can be further performed according to design requirements of the multi-layer substrate to complete the overall multi-layer substrate.

In FIG. 5C, the dielectric layer 506 is separated from the solder mask layer 502. The dielectric layer 506 and the at least one pad layer 504 embedded in the dielectric layer 506 are reversed to obtain a multi-layer substrate with no level difference between an upper surface of the at least one pad layer 504 and an upper surface of the dielectric layer 506.

In the present embodiment, the method for separating the multi-layer substrate (including the dielectric layer 506 and the at least one pad layer 504) from the surface of the solder mask layer 502 can be a sacrificial layer method or a carrier surface adhesion weakening method.

Figure 6:
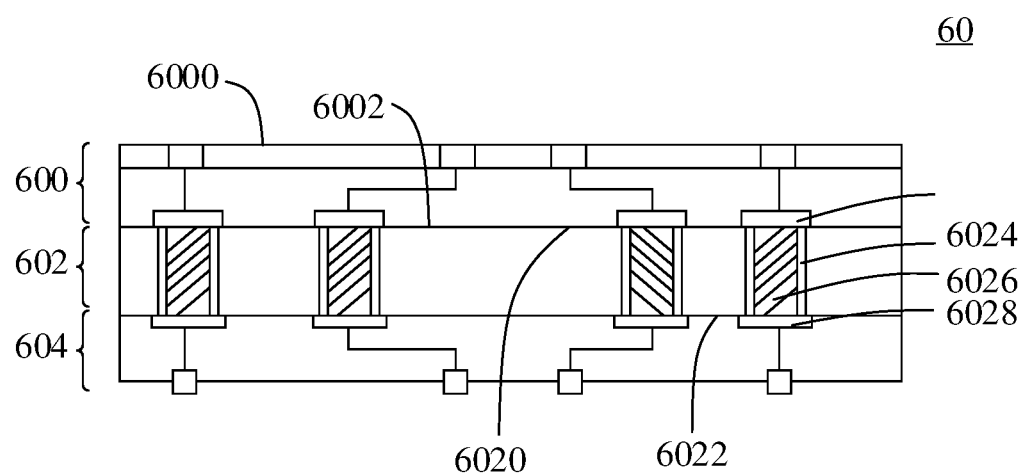
FIG. 6 illustrates a schematic cross-sectional view of a structure of a package substrate in accordance with another embodiment of the present disclosure.

Please refer to FIG. 6. FIG. 6 illustrates a schematic cross-sectional view of a structure 60 of a package substrate in accordance with another embodiment of the present disclosure. The structure 60 of the package substrate includes a first multi-layer substrate 600, a supporting substrate 602, and a second multi-layer substrate 604. The first multi-layer substrate 600 is a multi-layer film substrate and has a first surface 6000 and a second surface 6002 opposite to each other. In the present embodiment, the supporting substrate 602 can be a crystal-grown ceramic substrate, a glass substrate, or a rigid substrate which can provide a flat surface. A material of the crystal-grown ceramic substrate includes aluminum oxide crystals or aluminum nitride crystals. The supporting substrate 602 also has a first surface 6020 and a second surface 6022 opposite to each other. The supporting substrate 602 has a plurality of vertical vias 6024. The supporting substrate 602 has an electrically conductive material 6026 (shown by oblique lines) filled in the vertical vias 6024, so that the first surface 6020 of the supporting substrate 602 is electrically connected to the second surface 6022. The first surface 6020 of the supporting substrate 602 is disposed on the second surface 6002 of the first multi-layer substrate 600 and electrically connected to the first multi-layer substrate 600. There is no gap between the first surface 6020 of the supporting substrate 602 and the second surface 6002 of the first multi-layer substrate 600. The second surface 6022 of the supporting substrate 602 is electrically connected to the second multi-layer substrate 604. The second multi-layer substrate 604 is used for electrically connecting to a circuit board (not shown) or an electronic component (not shown). That is, at least one electrical connection point 6028 is disposed on the second surface 6022 of the supporting substrate 602 to electrically connect to the second multi-layer substrate 604.

The first multi-layer substrate 600 and the supporting substrate 602 of the structure 60 of the package substrate are respectively the same as the first multi-layer substrate 100 and the supporting substrate 102 of the structure 10 of the package substrate in FIG. 2. Implementations of the second multi-layer substrate 604 can refer to the related descriptions in FIG. 2, FIG. 4A to FIG. 4C, and FIG. 5A to FIG. 5C and are not repeater herein.

As shown in FIG. 6, the first multi-layer substrate 600 and the second multi-layer substrate 604 are electrically connected to the supporting substrate 602. There is no gap between the first multi-layer substrate 600 and the supporting substrate 602, and there is no gap between the second multi-layer substrate 604 and the supporting substrate 602. Horizontal stress of the first multi-layer substrate 600 against the supporting substrate 602 and horizontal stress of the second multi-layer substrate 604 against the supporting substrate 602 are substantially the same. By controlling the horizontal stress of the first multi-layer substrate 600 against the supporting substrate 602 to be substantially the same as the horizontal stress of the second multi-layer substrate 604 against the supporting substrate 602, deformation of the supporting substrate 602 can be minimized, thereby maintaining excellent flatness.

In one embodiment, by adjusting the structures of the first multi-layer substrate 600 and the second multi-layer substrate 604, a total thickness of the dielectric layers of the first multi-layer substrate 600 and a total thickness of the dielectric layers of the second multi-layer substrate 604 are substantially the same, and a total thickness of the metal wiring layers of the first multi-layer substrate 600 and a total thickness of the metal wiring layers of the second multi-layer substrate 604 are substantially the same, thereby controlling the structure 60 of the package substrate to have a substantially symmetrical structure to improve the strength of the structure.

An implementation of connecting electrical connection point of a bare die (not shown) to the pad layer of the first surface 6000 of the first multi-layer substrate 600 in the structure 60 of the package substrate is the same as that of the structure 10 of the package substrate in FIG. 2, and technical effect of the structure 60 of the package substrate is the same as that of the structure 10 of the package substrate.

Compared with conventional co-fired ceramic substrates, the present disclosure has no holes and excellent flatness to meet the needs of high-level package in the future. The wirings in the present disclosure can be disposed in the first multi-layer substrate 600 and the second multi-layer substrate 604. Organic polyimide is used as a dielectric material as an example. Compared with 9.4 of a conventional co-fired ceramic aluminum oxide or other ceramic materials, a dielectric constant of the organic polyimide is about 3 which is much lower. Apparently, compared with a conventional co-fired ceramic substrate or a FR4 PCB, the structure of the package substrate disclosed by the present disclosure has advantage of less attenuation of high-frequency signals. This also conforms with the development trend of semiconductors in the future.

A bare die on each structure of the package substrate of the present disclosure can be a single bare die or a plurality of bare dies. Types of bare die(s) can include various semiconductors, such as logic chips, memories, images sensor chips or the like. It is also possible to connect various passive components, various sensors, various antennae, and various electronic component circuits to the same structure of the package substrate to form an entire high-performance electronic system.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:

1. A structure of a package substrate, comprising:
    a first multi-layer substrate comprising a plurality of dielectric layers and a plurality of metal wiring layers and having a first surface and a second surface which are opposite to each other,
    wherein the dielectric layers and the metal wiring layers are alternately stacked, the dielectric layers are adhered to each other,
    the metal wiring layers are individually embedded in the corresponding dielectric layers, and
    a dielectric layer of the plurality of dielectric layers located in the first surface of the multi-layer substrate is used as a solder mask layer which is embedded with at least one pad layer; and
    a supporting substrate having a first surface and a second surface which are opposite to each other,
    wherein the first surface of the supporting substrate is disposed on the second surface of the first multi-layer substrate and electrically connected to the first multi-layer substrate,
    there is no gap between the first surface of the supporting substrate and the second surface of the first multi-layer substrate,
    the supporting substrate comprises a plurality of vertical vias, the vertical vias are used for electrically connecting the first surface of the supporting substrate to the second surface of the supporting substrate, and
    at least one electrical connection point is disposed on the second surface of the supporting substrate to electrically connect to a circuit board or an electronic component.

2. The structure of the package substrate according to claim 1, further comprising a second multi-layer substrate, wherein at least one electrical connection point is disposed on the second surface of the supporting substrate to electrically connect to the second multi-layer substrate, and the second multi-layer substrate is used for electrically connecting to a circuit board or an electronic component.

3. The structure of the package substrate according to claim 1, wherein the supporting substrate is a crystal-grown ceramic substrate, and a material of the crystal-grown ceramic substrate includes aluminum oxide crystals or aluminum nitride crystals.

4. The structure of the package substrate according to claim 1, wherein at least one electrical connection point of a bare die is electrically and correspondingly connected to the at least one pad layer in the first surface of the first multi-layer substrate to complete an electrical connection.

5. The structure of the package substrate according to claim 2, wherein there is no gap between the second surface of the second multi-layer substrate and the supporting substrate, and horizontal stress of the first multi-layer substrate against the supporting substrate and horizontal stress of the second multi-layer substrate against the supporting substrate are substantially the same.

6. The structure of the package substrate according to claim 2, wherein at least one electrical connection point of a bare die is electrically and correspondingly connected to the at least one pad layer in the first surface of the first multi-layer substrate to complete an electrical connection.

7. The structure of the package substrate according to claim 1, wherein the at least one pad layer is completely or partially embedded in the dielectric layer in the first surface of the first multi-layer substrate, and there is no height difference between an upper surface of the at least one pad layer and an upper surface of the dielectric layer in the first surface of the first multi-layer substrate.

8. The structure of the package substrate according to claim 1, wherein a material of each of the dielectric layers of the first multi-layer substrate is polyimide.

9. The structure of the package substrate according to claim 1, wherein the first multi-layer substrate further comprises a plurality of vias disposed in the dielectric layers and used for connecting the metal wiring layers.

* * * * *